(12) United States Patent
Ebihara et al.

(10) Patent No.: US 10,356,351 B1
(45) Date of Patent: Jul. 16, 2019

(54) IMAGE SENSOR WITH DUAL CONVERSION GAIN READOUT

(71) Applicant: OmniVision Technologies, Inc., Santa Clara, CA (US)

(72) Inventors: Hiroaki Ebihara, Santa Clara, CA (US); Rui Wang, San Jose, CA (US); Yandong Chen, Santa Clara, CA (US); Eiichi Funatsu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/890,762

(22) Filed: Feb. 7, 2018

(51) Int. Cl.
| | |
|---|---|
| H04N 5/335 | (2011.01) |
| H04N 5/3745 | (2011.01) |
| H04N 5/378 | (2011.01) |
| H01L 27/146 | (2006.01) |
| H04N 5/355 | (2011.01) |
| H04N 5/235 | (2006.01) |
| H04N 5/357 | (2011.01) |

(52) U.S. Cl.
CPC ... *H04N 5/37455* (2013.01); *H01L 27/14605* (2013.01); *H01L 27/14609* (2013.01); *H01L 27/14643* (2013.01); *H04N 5/2355* (2013.01); *H04N 5/3559* (2013.01); *H04N 5/3575* (2013.01); *H04N 5/378* (2013.01)

(58) Field of Classification Search
CPC .................................................. H04N 5/37455
See application file for complete search history.

(56) References Cited

U.S. PATENT DOCUMENTS

| | | | |
|---|---|---|---|
| 8,686,339 B2* | 4/2014 | Mabuchi | H04N 5/363 250/208.1 |
| 9,055,250 B2 | 6/2015 | Park et al. | |
| 9,774,811 B1 | 9/2017 | Ebihara et al. | |
| 2014/0266309 A1 | 9/2014 | Jakobson | |
| 2015/0237274 A1 | 8/2015 | Yang et al. | |
| 2017/0099423 A1* | 4/2017 | Cremers | H04N 5/2355 |

OTHER PUBLICATIONS

U.S. Appl. No. 15/277,648—Comparator for Double Ramp Analog to Digital Converter, filed Sep. 27, 2016, 40 pages.
(Continued)

*Primary Examiner* — Gary C Vieaux
(74) *Attorney, Agent, or Firm* — Christensen O'Connor Johnson Kindness PLLC

(57) ABSTRACT

A method includes reading a first analog reference signal from a first storage node in a dual conversion gain pixel, and converting the first analog reference signal to a first digital reference signal using a comparator coupled to the dual conversion gain pixel. The method also includes reading a first analog image signal from the first storage node, and converting the first analog image signal to a first digital image signal using the comparator. A second analog image signal may be read from the first storage node and a second storage node in the dual conversion gain pixel, and the second analog image signal may be converted to a second digital image signal. A second analog reference signal may be read from the first storage node and the second storage node, and the second analog reference signal may be converted to a second digital reference signal using the comparator.

20 Claims, 13 Drawing Sheets

(56) References Cited

OTHER PUBLICATIONS

U.S. Appl. No. 15/277,642—Ramp-Signal Generator and Comparator for Double Ramp ADC, filed Sep. 27, 2016, 39 pages.
Figueiredo et al., "Kickback Noise Reduction Techniques for CMOS Latched Comparators," IEEE Express Briefs, vol. 53, No. 7, pp. 541-545, Jul. 2006.
U.S. Appl. No. 15/486,896—Dual Conversion Gain High Dynamic Range Readout for Comparator of Double Ramp Analog to Digital Converter, filed Apr. 13, 2017, 29 pages.

* cited by examiner

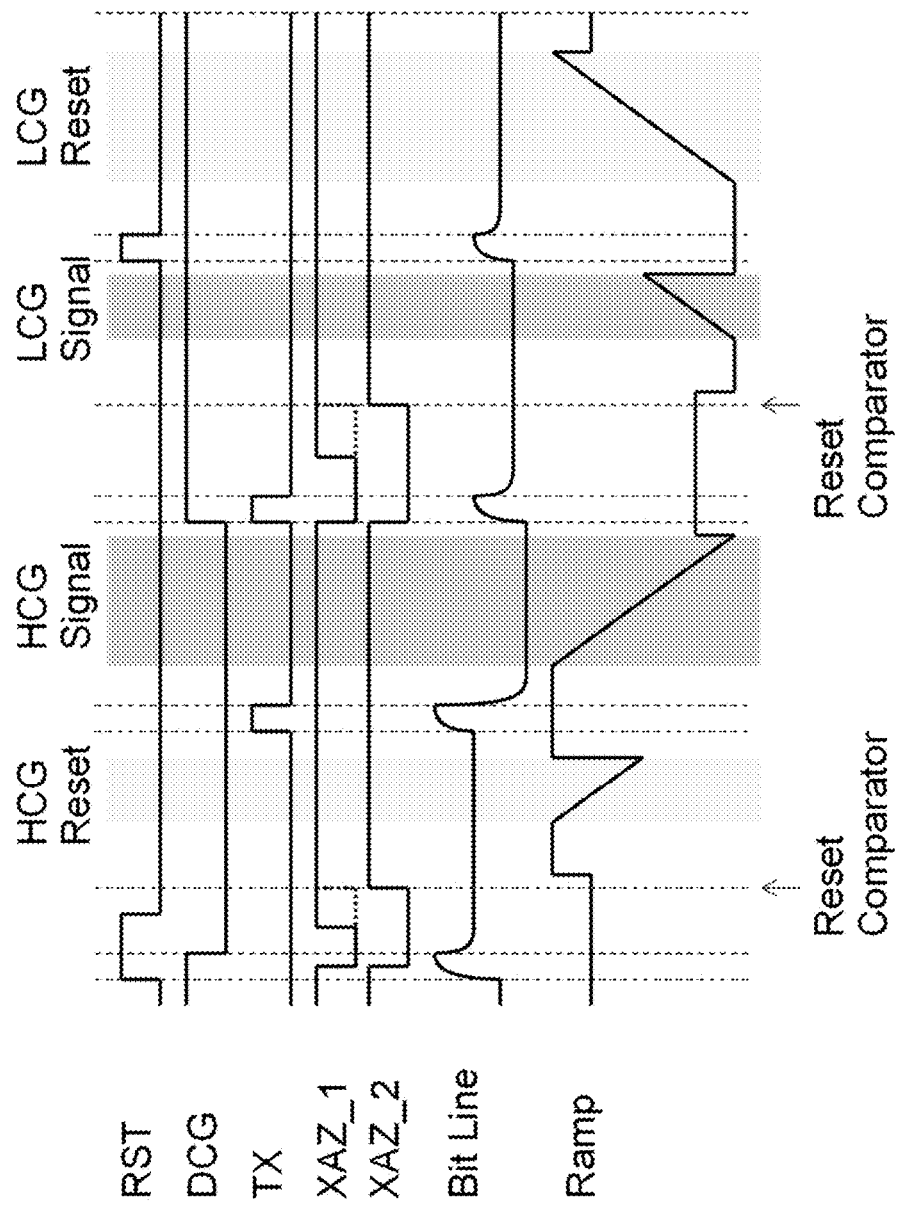

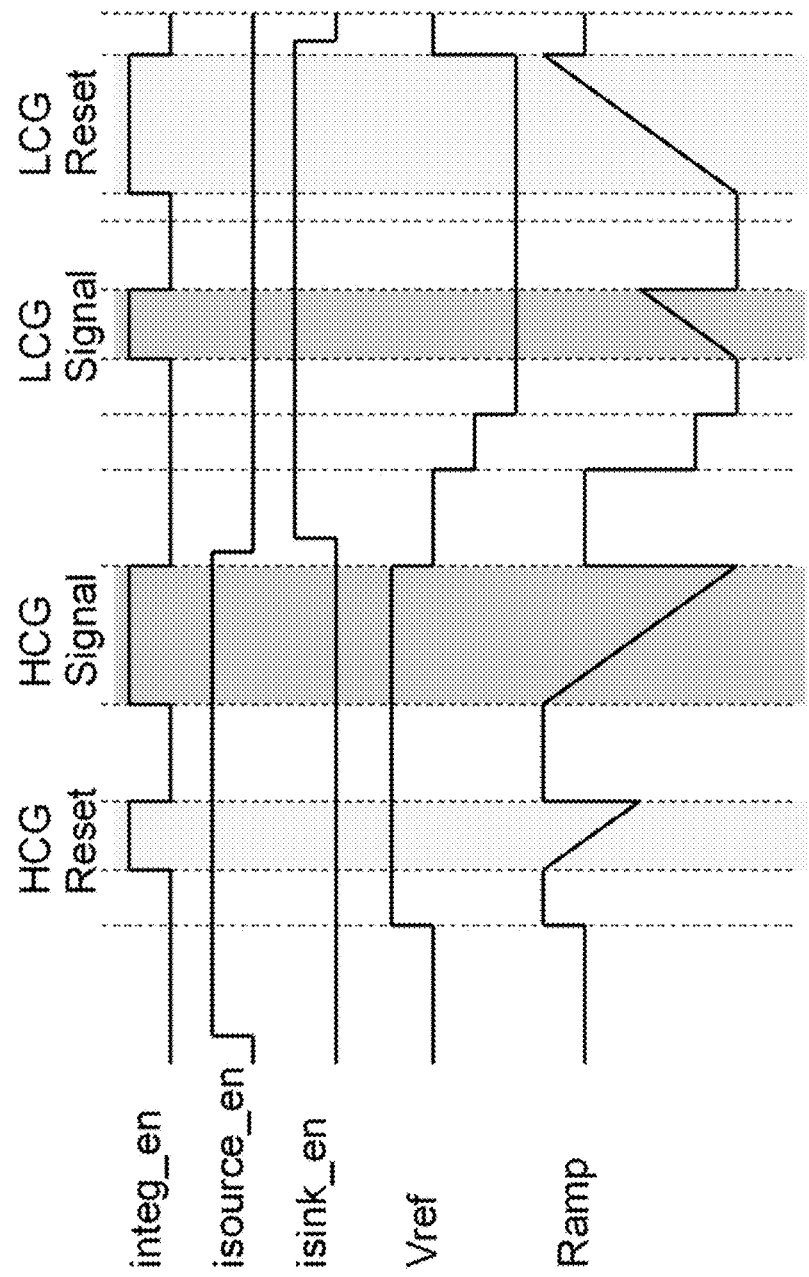

US 10,356,351 B1

IMAGE SENSOR WITH DUAL CONVERSION GAIN READOUT

TECHNICAL FIELD

This disclosure relates generally to image sensors, and in particular but not exclusively, relates to analog to digital conversion (ADC).

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

The charge may be converted into a digital representation of the charge by analog-to-digital converter (ADC) circuits in the image sensor based on a comparison to a reference voltage signal. However, if the amount of generated charge is more than the voltage range of the ADC circuits, the digital representation of the charge may not be correct.

Many techniques have been employed to increase the voltage range of the ADC circuits. However, some of these techniques may not provide the desired range.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIGS. 6A-6F illustrate timing diagrams for electronics in, and coupled to, the comparator depicted in FIG. 2, in accordance with the teachings of the present disclosure.

Figure 1A:
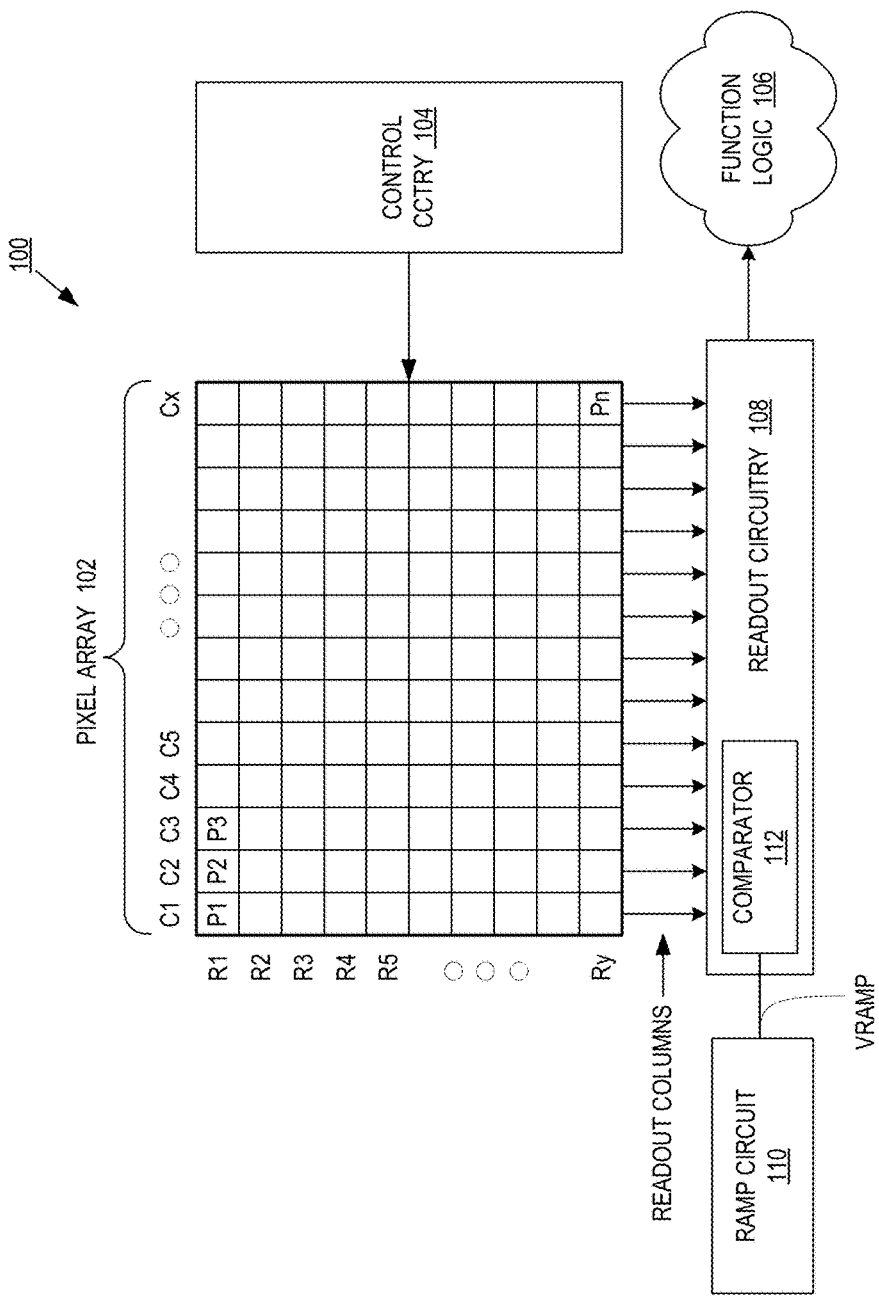
FIG. 1A illustrates one example of an imaging system, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus, system and method relating an image sensor with dual conversion gain readout are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

With dual conversion gain (DCG) pixels, wider dynamic range can be achieved by reading out one signal at low conversion gain (LCG) and one at high conversion gain (HCG), and then combining the signals together (resulting in high dynamic range (HDR) readout). In DCG readouts, there is generally a large difference in the bitline reset level between LCG readout and HCG readout. In some solutions to this problem, comparators having two input stages could be used, but the size of the comparator becomes larger than a conventional comparator. This consumes additional space on the integrated circuit chip. In this disclosure, DCG readout methods with small size comparators are introduced. Additionally, a new pixel readout scheme is proposed: HCG reset, followed by readout of the HCG image signal, followed by readout of the LCG image signal, and then LCG reset.

FIG. 1A illustrates one example of an imaging system 100 in accordance with an embodiment of the present disclosure. Imaging system 100 includes pixel array 102, control circuitry 104, readout circuitry 108, and function logic 106. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 108 and then transferred to function logic 106. Readout circuitry 108 may be coupled to readout image data from the plurality of photodiodes in pixel array 102. In various examples, readout circuitry 108 may include amplification circuitry, analog-to-digital (ADC) conversion circuitry, or otherwise. In some examples, one or more comparators 112 may be included for each of the readout columns. Function logic 106 may simply store the image data or even manipulate the image data by applying post image effects (e.g., crop, rotate, remove red eye, adjust brightness, adjust contrast, or otherwise). In one example, readout circuitry 108 may readout a row of image data at a time along readout column lines (illustrated) or may readout the image data using a variety of other techniques (not illustrated), such as a serial readout or a full parallel readout of all pixels simultaneously.

To perform ADC, for example, the readout circuitry 108 may receive a reference voltage VRAMP from a ramp circuit 110. VRAMP may be received by the comparator 112, which may also receive image charge from a pixel of the pixel array 102. The comparator 112 may determine a digital representation of the image charge based on a comparison of VRAMP to the image charge voltage level. The signal VRAMP may be at various voltage levels depending on the timing of the ADC operation, and may be used to auto-zero the inputs of the comparator 112 before image charge is received, e.g., read, by the readout circuitry 108. In some examples, VRAMP may be increased when the inputs are auto-zeroed, which may provide an increase to the voltage range used during signal comparison, for example. Although ramp circuit 110 is shown as a separate block of the imaging system 100, ramp circuit 110 may be included in other blocks, such as the column readout circuit 108, or a voltage generator block (not shown).

In one example, control circuitry 104 is coupled to pixel array 102 to control operation of the plurality of photodiodes in pixel array 102. For example, control circuitry 104 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 1B:
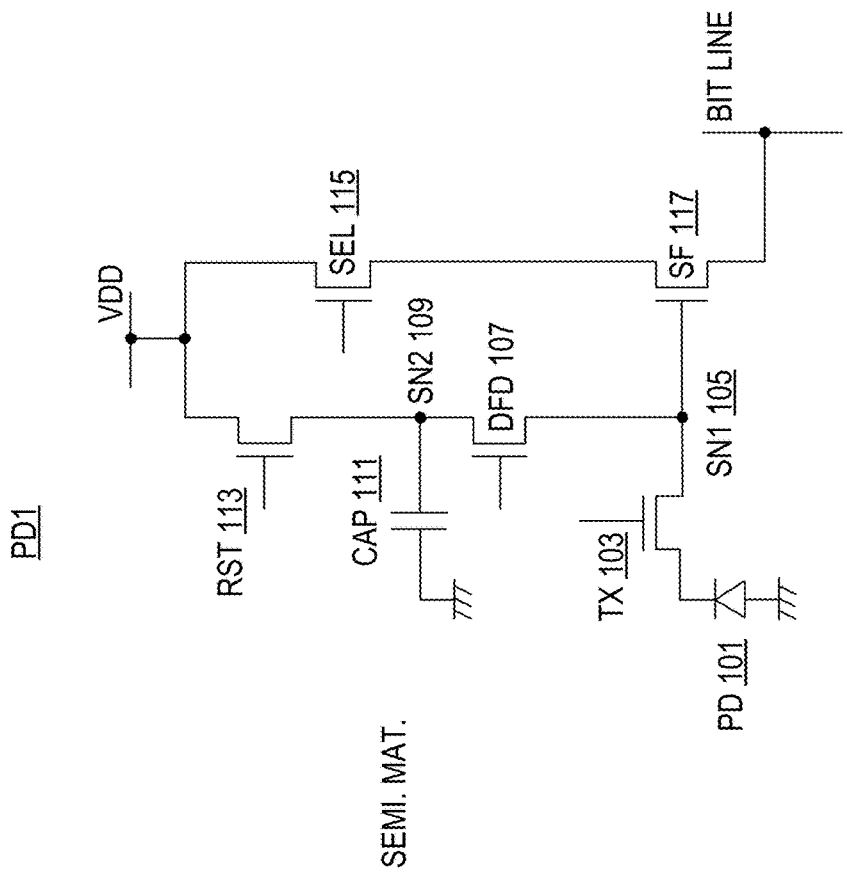
FIG. 1B illustrates a schematic of an example dual conversion gain pixel, which may be included in the system of FIG. 1A, in accordance with the teachings of the present disclosure.

FIG. 1B illustrates a schematic of an example dual conversion gain pixel (e.g., PD1), which may be included in the system in FIG. 1A. Illustrated are photodiode 101, transfer transistor 103, first storage node 105 (e.g., a floating diffusion), dual floating diffusion transistor 107, second storage node 109 (e.g., including a floating diffusion and capacitor 111), reset transistor 113, select transistor 115, and source follower transistor 117.

As shown, all components may be disposed in a semiconductor material or substrate. Photodiode 101 transfers first analog image charge (generated in response to incident light on photodiode 101) to first storage node 105 when a transfer signal is applied to the gate terminal of transfer transistor 103. Source follower transistor 117 may then amplify the first analog signal on first storage node 105, and that signal may be read out to the bitline when select transistor 115 is turned on. Reading out the charge on first storage node 105 may be used to form an image with high conversion gain. Similarly, charge may be read out of photodiode 101 to first storage node 105, and, if additional charge needs to be absorbed, dual floating diffusion gate 107 may be turned on to store charge in second storage node 109 (and capacitor 111). Source follower transistor 117 may then be used to amplify the second analog image charge contained in first storage node 105 and second storage node 107 which is readout to the bitline. This image data may be used to form an image with low conversion gain. Image charge in the dual conversion gain pixel may be reset by turning on reset gate (and other transistors).

In some examples, a first analog reference signal may be read out of first storage node 105 when no image charge is in first storage node 105. A second analog reference signal may be read out of both first storage node 105 and second storage node 109 when no image charge is stored in nodes 105/109. It is appreciated that the first and second reference signals may be subtracted from the image signals and may be used to correct for noise. Moreover, the low conversion gain and high conversion gain image signals may be combined to form a high dynamic range image.

Figure 2:
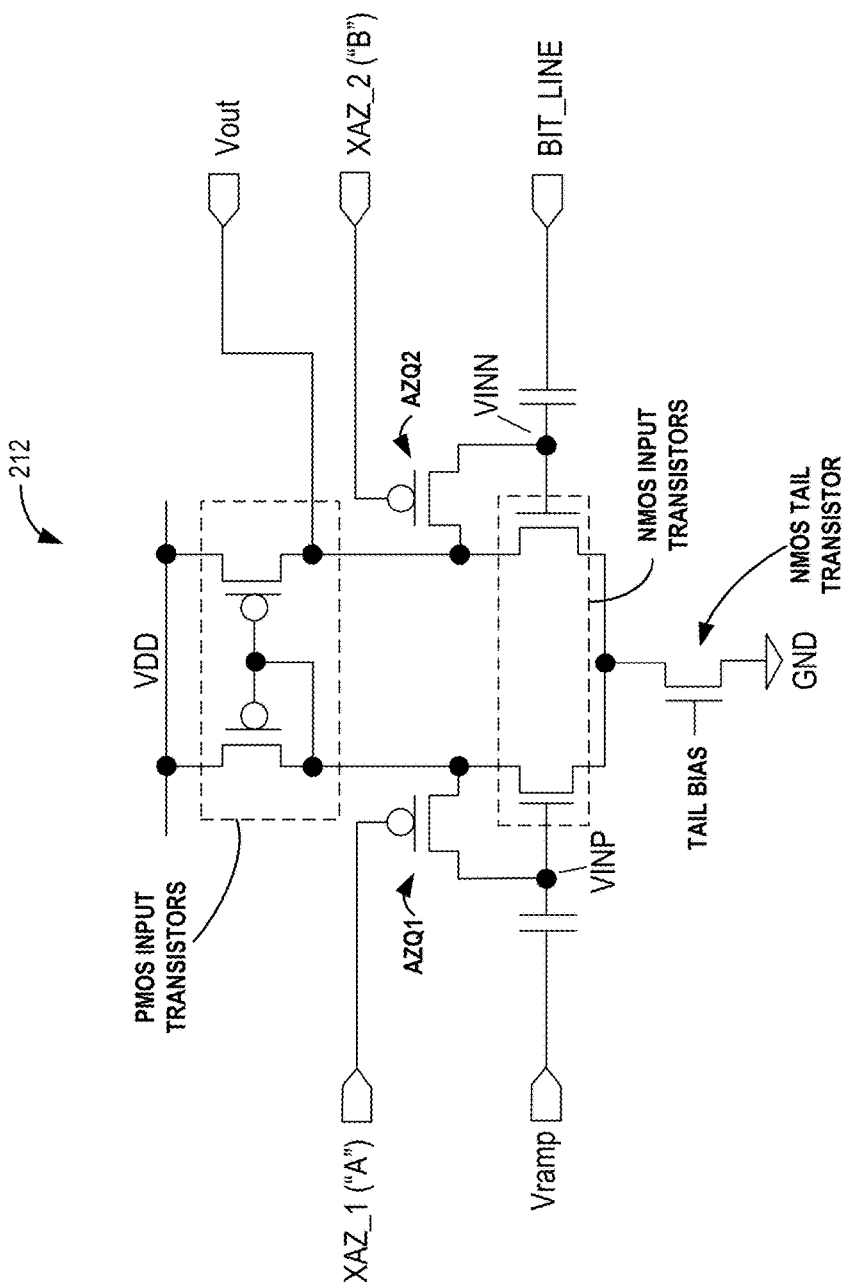
FIG. 2 illustrates a schematic of a comparator, in accordance with the teachings of the present disclosure.

FIG. 2 is a schematic of comparator 212 in accordance with an embodiment of the present disclosure. Comparator 212 may be an example of comparator 112 of FIG. 1A. Comparator 212 may provide an output signal in response to a comparison of an image charge signal received on the bitline input to a reference voltage signal VRAMP received on the VRAMP input.

In one example, a first analog reference signal may be read from a first storage node in a dual conversion gain pixel (see e.g., PD1 in FIG. 1A) and comparator 212 may be used, at least in part, to convert the first analog reference signal to a first digital reference signal. Then, a first analog image signal may be read from the first storage node in the dual conversion gain pixel, and comparator 212 may convert the first analog image signal to a first digital image signal. Following this, a second analog image signal may be read from the first storage node and a second storage node in the dual conversion gain pixel, and comparator 212 may be used to convert the second analog image signal to a second digital image signal. Next, a second analog reference signal may be read from the first storage node and the second storage node in the dual conversion gain pixel, and comparator 212 may convert the second analog reference signal to a second digital reference signal.

The illustrated embodiment of comparator 212 includes an NMOS tail transistor coupled between a reference voltage, ground in some examples, and two (first and second) NMOS input transistors. The NMOS tail transistor may be coupled to receive a TAIL BIAS signal at a gate, which may enable/disable the NMOS tail transistor, and in turn comparator 212. The first and second NMOS input transistors may be coupled in parallel between the NMOS tail transistor and first and second PMOS transistors. The two PMOS transistors may be coupled in parallel between the two NMOS input transistors and a reference voltage, VDD for example. The two PMOS transistors may further be coupled together by their gates. Additionally, the comparator 212 may include two auto-zero switches, AZQ1 and AZQ2, coupled between gates of respective ones of the two NMOS input transistors and the drain sides of the same NMOS input transistors. In some examples, two noise filtering capacitors, may be included to capacitvely couple their respective inputs to the gates of the two NMOS input transistors.

The comparator 212 may be described as having a reference voltage input side and a bitline, e.g., image charge, input side. The reference voltage input side may receive a reference voltage VRAMP, and the bitline input side may receive an image charge voltage signal. The reference voltage input side may include one of the NMOS input transistors, auto-zero switch AZQ1, and one of the PMOS transistors. The gate of the PMOS transistor of the reference voltage input side may be coupled to a drain of the same transistor, which may result in the gate both PMOS transistors coupled to the drain forming a current mirror. The image charge input side may include one of the NMOS transistors, auto-zero switch AZQ2, and one of the PMOS transistors.

In operation, comparator 212 may compare a voltage level of an image charge signal on the bitline input to a voltage level of the VRAMP reference signal during an ADC operation. The voltage range of the VRAMP signal during ADC, may be used to determine the image charge level, for example. However, prior to ADC, the inputs to the comparator, e.g., VRAMP and bitline, may be normalized, e.g., auto-zeroed, to a base voltage level of of the PMOS transistors, which may be referred to herein as the auto-zero voltage level. Control signals A and B provided to the gates of AZQ1 and AZQ2, respectively, may couple/decouple the gates of the NMOS input transistors from their respective drains before an ADC operation is performed. Normalizing the voltages on the gates of the NMOS input transistors may force the inputs to the same voltage level so to remove any error or noise from the ADC operation.

In some examples, increasing the auto-zero voltage level may allow comparator 212 to determine larger image charge values. One technique to increase the auto-zero voltage level may be to increase the voltage of VRAMP during an auto-zero operation of the comparator 212. For example, a voltage level of VRAMP may be increased while the comparator 212 is normalized, such as after AZQ1 is disabled but before AZQ2 is disabled. Increasing the auto-zero voltage may result in an increase in the voltage range of the comparator 212 because the voltage difference between the auto-zero voltage level and a minimum input voltage level may be increased, which may result in the increase in the voltage range of the comparator 212.

Comparator 212 can be reset by making XAZ_1 and XAZ_2 logic low. The reset operation ends by turning both of XAZ_1 and XAZ_2 logic high. XAZ_1 may be turned to logic high prior to, or at the same time as, XAZ_2 is turned logic high. Comparator 212 may be reset before ADC for HCG Reset. This way, the operating point of comparator 212 is adjusted to the bitline voltage at HCG readout. When comparator 212 is reset, kT/C noise may be induced in the floating nodes, Vinn and Vinp. But the reset noise of comparator 212 and the comparator offset can be cancelled by subtracting the output at HCG reset from output at HCG signal because comparator 212 is reset only once during HCG readout.

Similarly, the comparator is reset before ADC for the LCG signal. This way, the operating point of the comparator is adjusted to the bitline voltage at LCG mode. Also the reset noise of the comparator 212 and the comparator offset can be cancelled by subtracting reset and signal outputs for LCG, because comparator 212 is reset only once during LCG readout.

Figure 3:
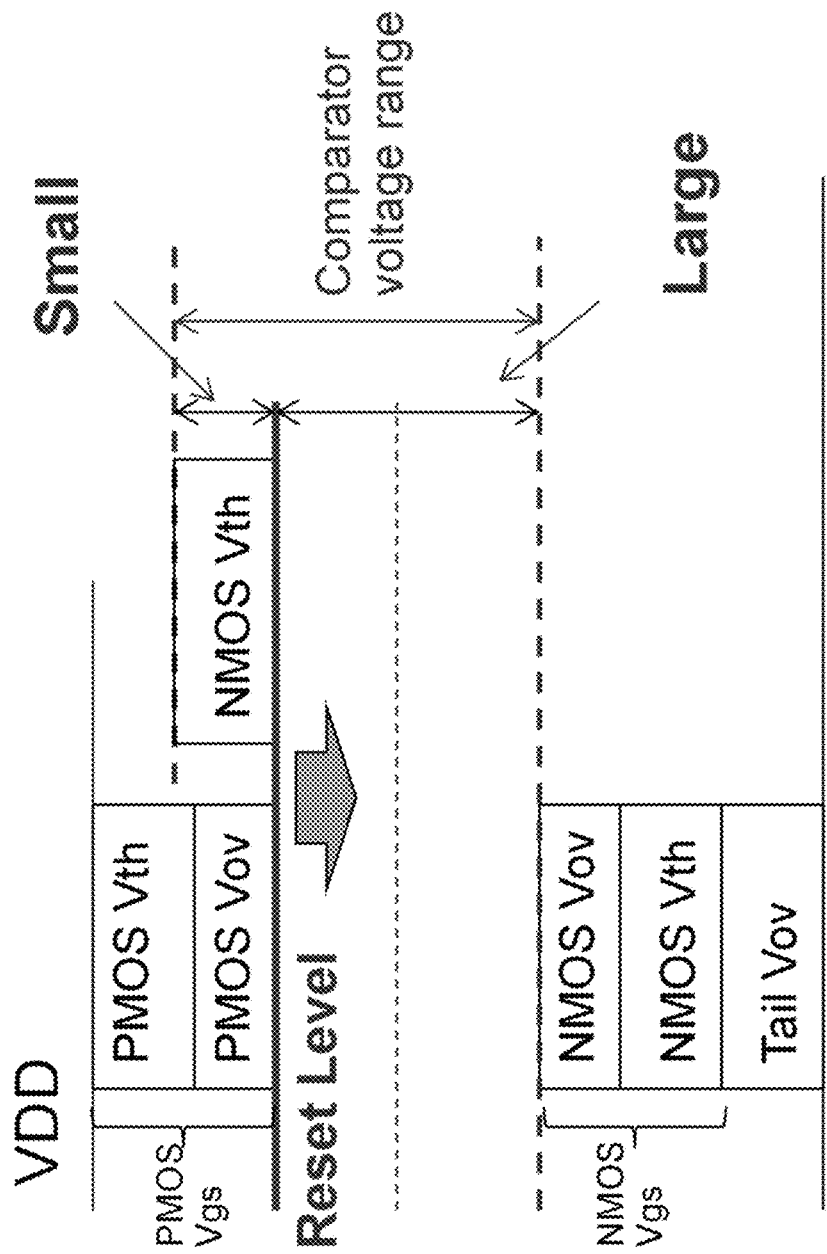
FIG. 3 illustrates relative voltage ranges of the comparator in FIG. 2, in accordance with the teachings of the present disclosure.

FIG. 3 illustrates relative voltage ranges of the comparator in FIG. 2, in accordance with the teachings of the present disclosure. As stated above, one problem with designing devices for this application is that the voltage range of the comparator may not be adequate. For example, the comparator has larger voltage range on the lower side but smaller voltage range for the higher side. In examples of disclosure, the low conversion gain (LCG) image signal is readout prior to LCG reset. The bitline voltage may be higher after the comparator is reset for LCG signal readout. This means that the initial voltage range of the comparator for receiving the LCG signal to the reset process may be lowered. Using the ramp and offset techniques discussed herein, this disclosure keeps the voltage supplied to the comparator in an operational range.

Figure 4:
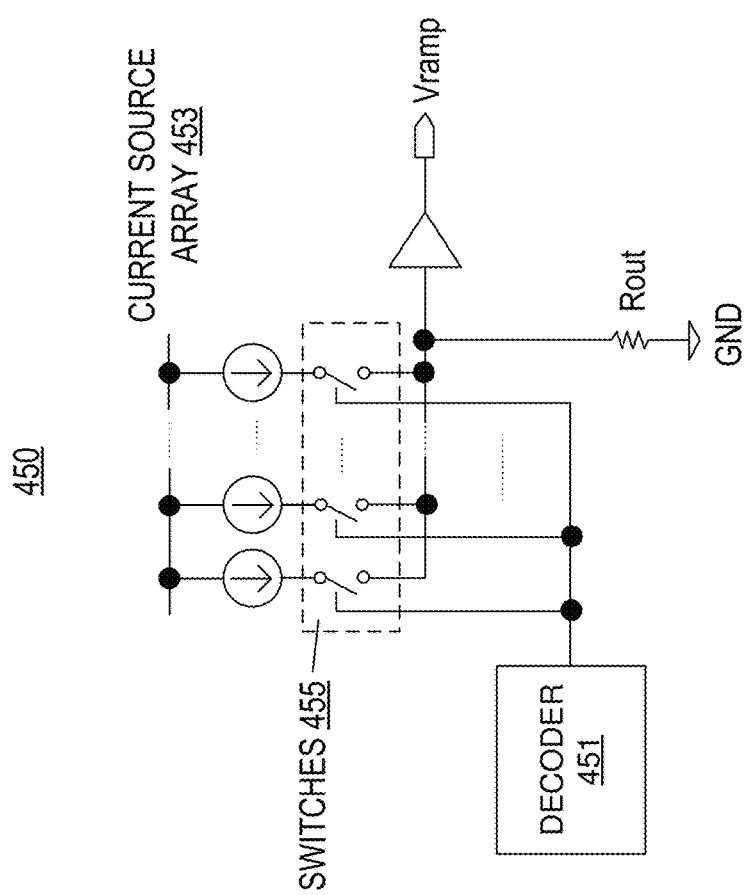
FIG. 4 illustrates a schematic of a binary ramp circuit which may be coupled to the comparator of FIG. 2, in accordance with the teachings of the present disclosure.

FIG. 4 illustrates a schematic of an example ramp circuit 450 which may be coupled to the comparator of FIG. 2 to generate a ramp signal. By changing the output of decoder 451, the ramp generator can generate the signal shown in FIGS. 6A-6B. As shown, ramp circuit 450 includes using a current source array 453 coupled to decoder 451 to generate the ramp signal. Decoder 451 is coupled to gate terminals of a plurality of switches 455 to individually activate each of the plurality of switches 455. Plurality of switches 455 is coupled between the current source array 453 and an output of the ramp circuit 450. In the depicted example, a driver is also coupled between the current source array 453 and the output of ramp circuit 450. A resistor ("Rout") is also coupled between ground, current source array 453 and the output of ramp circuit 450.

Figure 5:
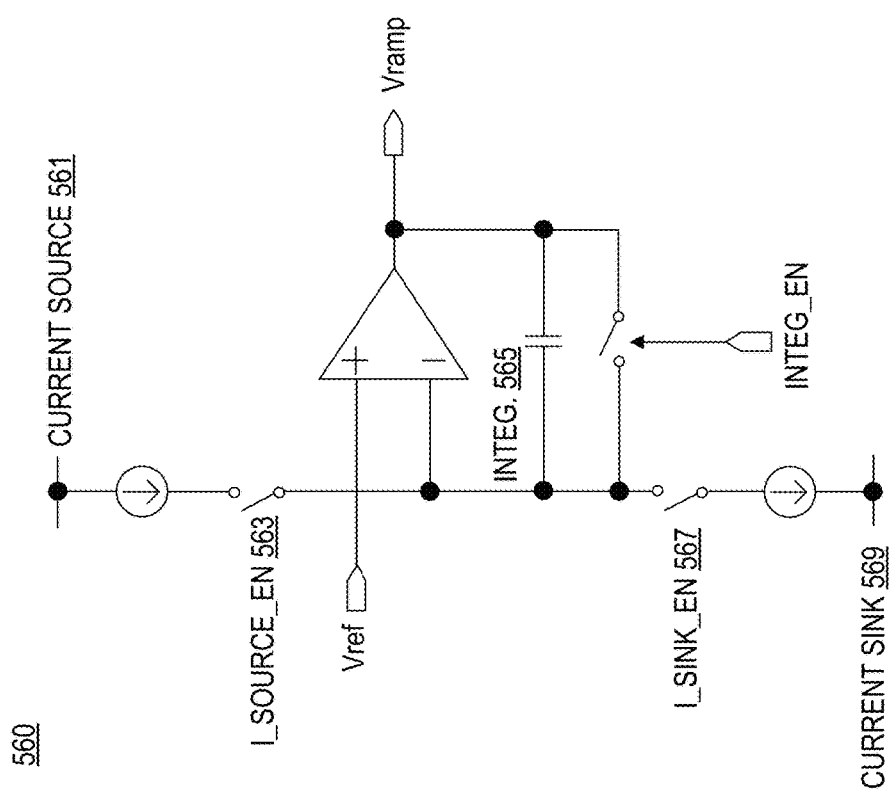
FIG. 5 illustrates a schematic of a current integration ramp circuit which may be coupled to the comparator of FIG. 2, in accordance with the teachings of the present disclosure.

FIG. 5 illustrates a schematic of an example current integration ramp circuit 560 which may be coupled to the comparator of FIG. 2 to generate a ramp signal. As shown, ramp circuit 560 includes a current integrator (e.g., an operational amplifier with a capacitor and switch) coupled between current source 561, a current sink 569, and an output of the ramp generator. As shown first switch 563 is coupled between current source 561 and the current integrator 565, and second switch 567 is coupled between current sink 569 and current integrator 565. This configuration allows for controlling a direction of the ramp signal (see e.g., FIG. 6D, ramp signal going down for HCG signals, and ramp signal going up for LCG signals) by turning on first switch 563 or second switch 567. Turning on first switch 563 or the second switch 567 connects an input of the amplifier to the current source 561 or the current sink 569. This helps to keep the comparator within its prescribed limits.

In current integration, the ramp generator 560 may output the ramp voltage offset between: (1) the $1^{st}$ comparator reset and ramp start of HCG reset; (2) the $2^{nd}$ comparator reset and LCG signal (e.g., shown in FIGS. 6A-6B); (3) XAZ_1 to logic high and XAZ_2 to logic high (for example in FIG. 6B). Voltage offsets can be generated by changing "Vref" voltage (as shown in FIG. 6C), or they can be generated by sinking or sourcing current to "integ." node in FIG. 5. However, large voltage offsets between the LCG signal and LCG reset may be generated by sinking current through the current source, because the offset should match the ramp signal accurately and not to change the operating point of the current integrator too much. This offset may be added to the output of LCG reset so that the error in the voltage offset will add up to the final output.

FIGS. 6A-6F illustrate timing diagrams for electronics in, and coupled to, the comparator depicted in FIG. 2, in accordance with the teachings of the present disclosure. It is appreciated that the timing diagrams depicted are just one of many ways to control the circuit in FIG. 2.

Figure 6A:
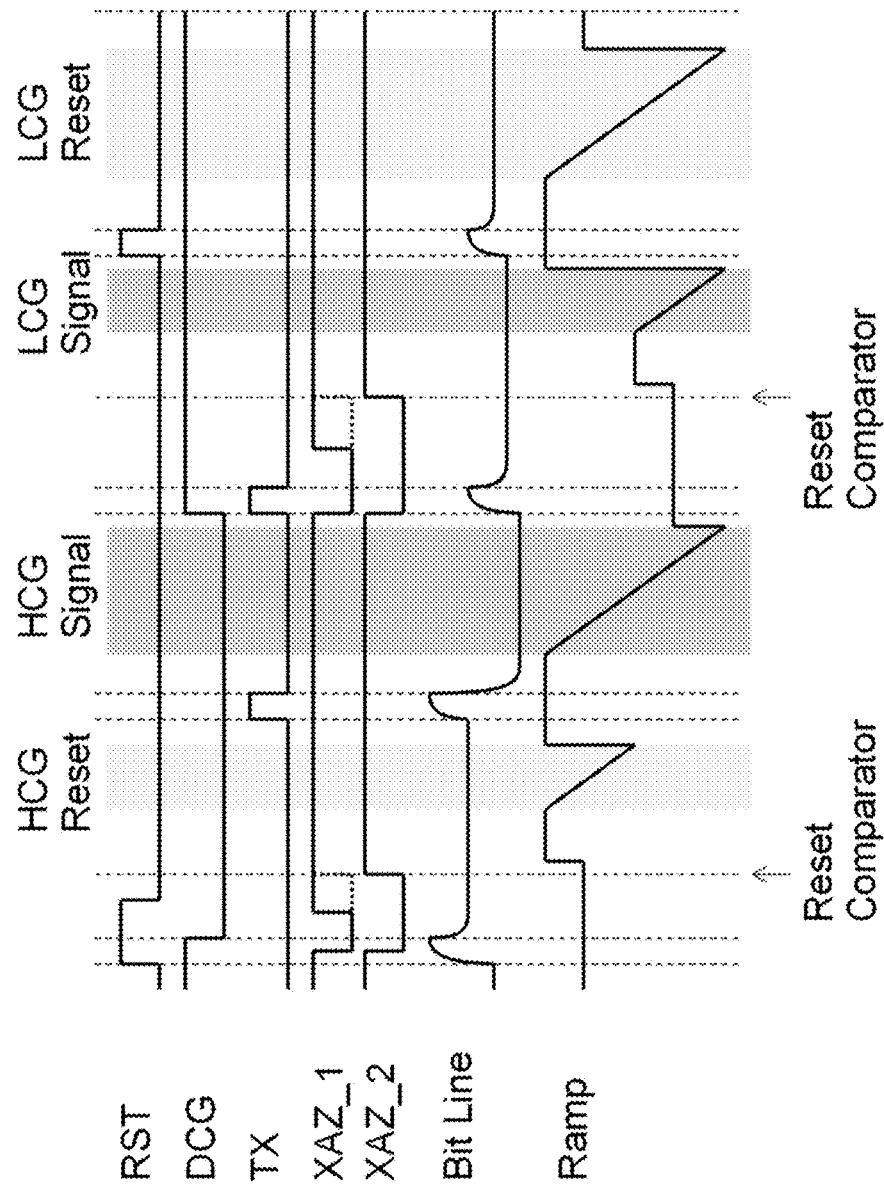

FIG. 6A depicts operation of a comparator (e.g., comparator 212 in FIG. 2). As depicted the readout/ADC conversion sequence is: (1) HCG reset; (2) HCG signal; (3) LCG signal; (4) LCG reset. The length of the ramp is used to convert the image and reference signals into the digital domain. However, as described in connection with FIG. 3, a small comparator may not have the requisite voltage range.

Figure 6B:
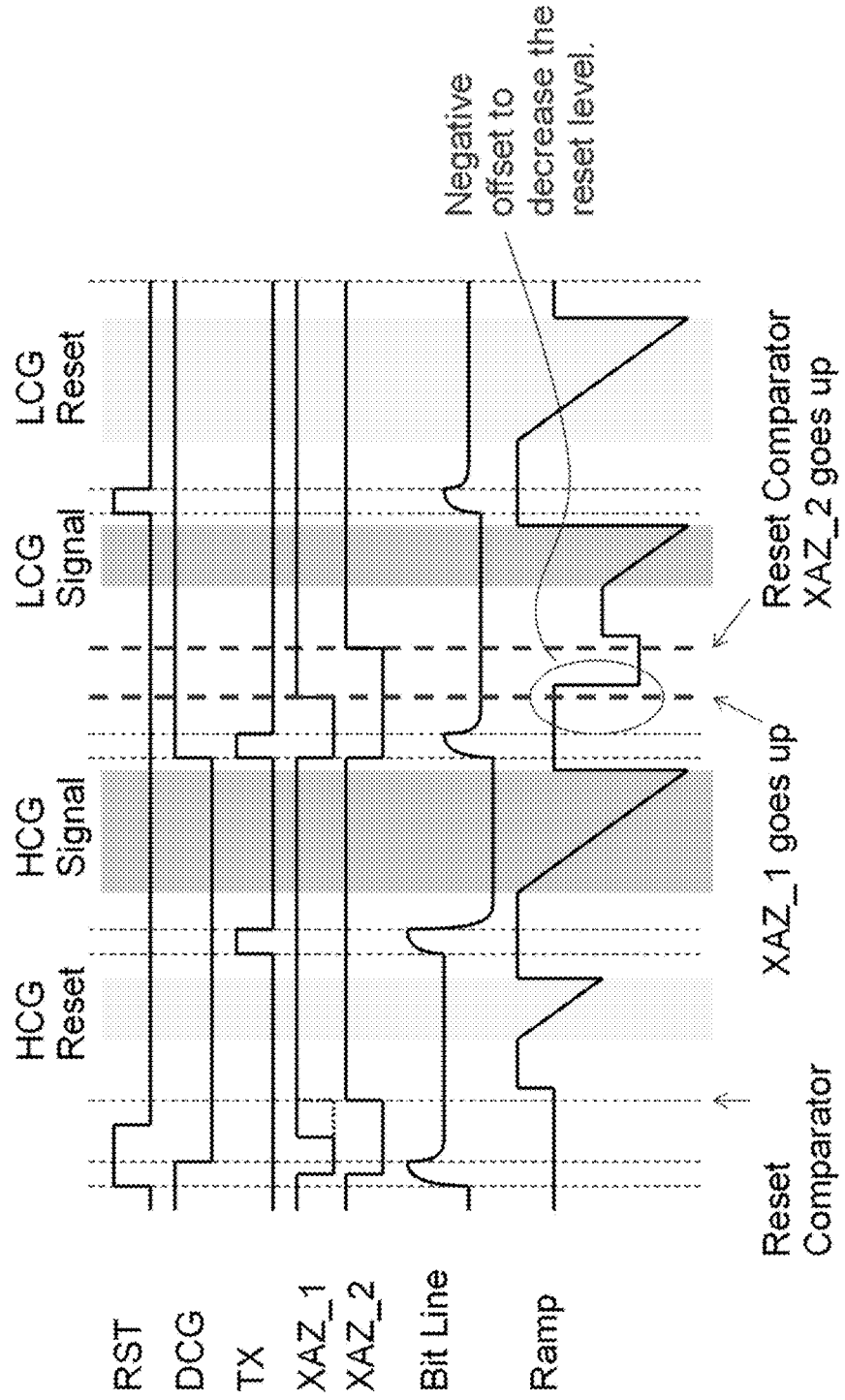
Figure 6C:
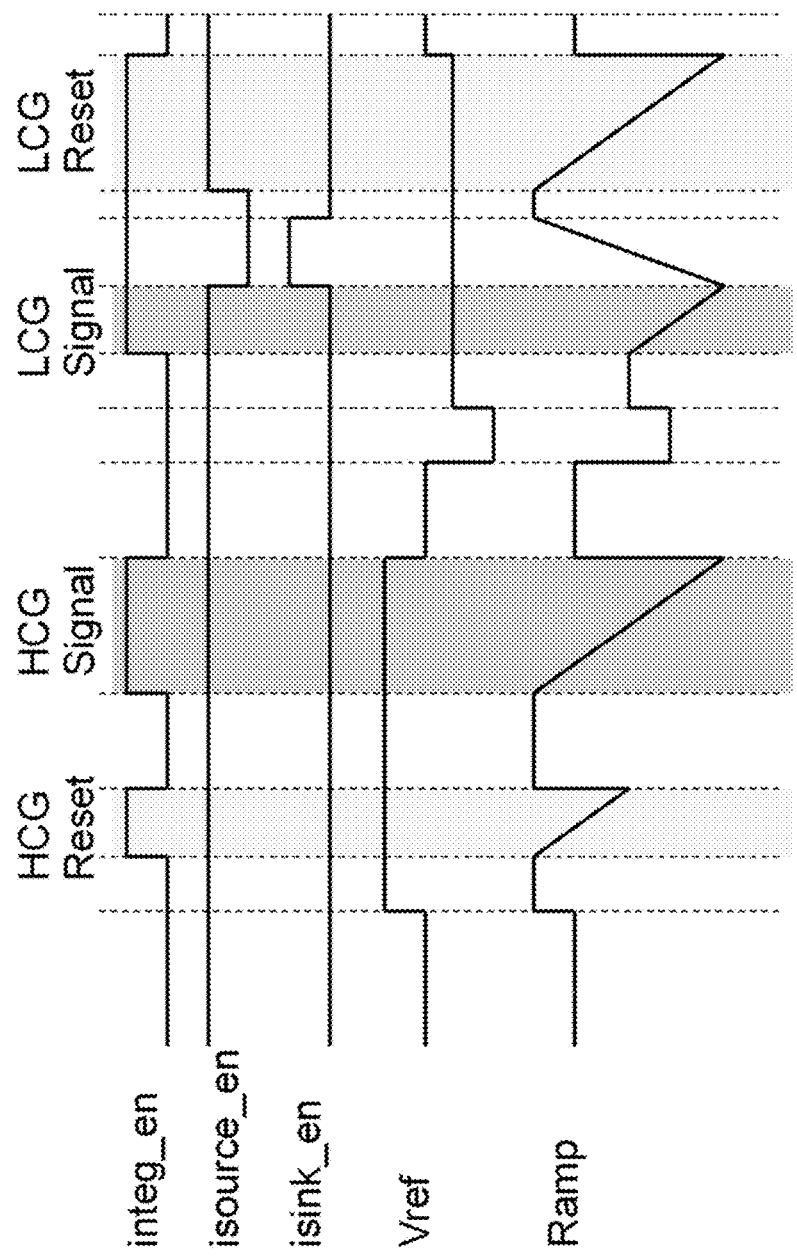

FIG. 6B depicts a similar timing diagram as FIG. 6A, however FIG. 6B includes using a negative offset of the ramp signal to decrease the reset level of the comparator. As shown, the ramp voltage is increased after comparator is reset before starting ADC for the LCG reset. If the voltage of the floating nodes, Vinn and Vinp (see e.g., nodes in FIG. 2), are increased too much, the input devices of the comparator can slip into the linear region at the flipping point. In the linear region, the gain of the comparator becomes small so that error can be large when the comparator makes its match decision. In general, the voltage increment in the floating nodes, Vinn and Vinp, between when the comparator is reset and when the comparator makes a decision should be much smaller than the threshold voltage of the input devices if the comparator is reset in the manner shown in FIG. 6A.

In some examples, the voltage range of the ADC can be increased by changing the reset sequence. As shown in FIG. 6B, the voltage of the ramp signal is decreased after XAZ_1 is turned to logic high. When XAZ_1 is logic high and XAZ_2 is logic low, the comparator operates as voltage follower and "Vout" and "Vinn" are almost same voltage as "Vinp". Accordingly, if the ramp voltage is decreased, "Vinp", "Vout" and "Vinn" also decrease. This way, "Vinp" and "Vinn" can be lowered when the comparator is reset. This will put input devices in the saturation region, regardless of whether the voltages of bitline and ramp signal are increased after the reset or not.

FIG. 6C depicts a similar timing diagram as FIG. 6B, however FIG. 6C includes using bidirectional ramp signals (e.g., signals produced by the ramp circuit in FIG. 5). The voltage offset between the LCG signal and the LCG reset are generated by sinking current from "integ" node (see e.g., FIG. 5), and the other voltage offsets are generated by "Vref". One of ordinary skill in the art will appreciate that other offsets also can be generated by the current sink or current source current sources in the same way.

FIG. 6D is similar to FIG. 6A, however, FIG. 6D employs a bidirectional ramp signal during the LCG signal and the LCG reset readouts. Put another way, the ramp signals are in opposite directions. This way, there is no need to generate a voltage offset between the LCG signal and the LCG reset, the device simply needs to reset the integrator by turning "integ_en" signal (see e.g., FIG. 5) to logic low to short the capacitor.

Figure 6E:
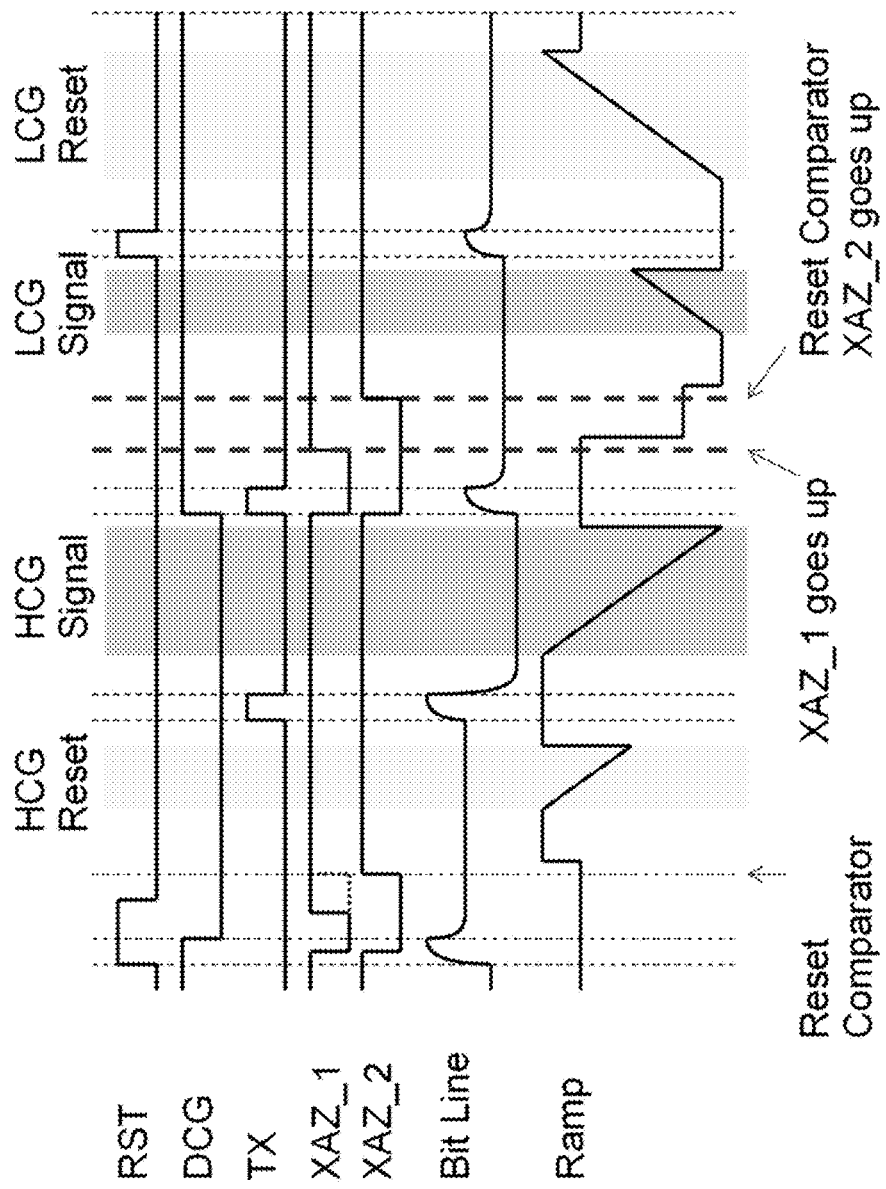

FIG. 6E is similar to FIG. 6B, however, FIG. 6E employs both an offset voltage and a bidirectional ramp signal for the readouts of the LCG signal and LCG reset.

FIG. 6F depicts the current integration ADC control signal for the timing diagram of FIG. 6E. It is appreciated that the ramp circuit in FIG. 5 may be used to generate the ramp signal depicted. It is also appreciated that while there is no express need to generate voltage offset between LCG signal and LCG reset, the offset voltage can be generated by using current source and current sinks of the device depicted in FIG. 5. However, this may enhance the efficiency of the comparator.

Figure 7:
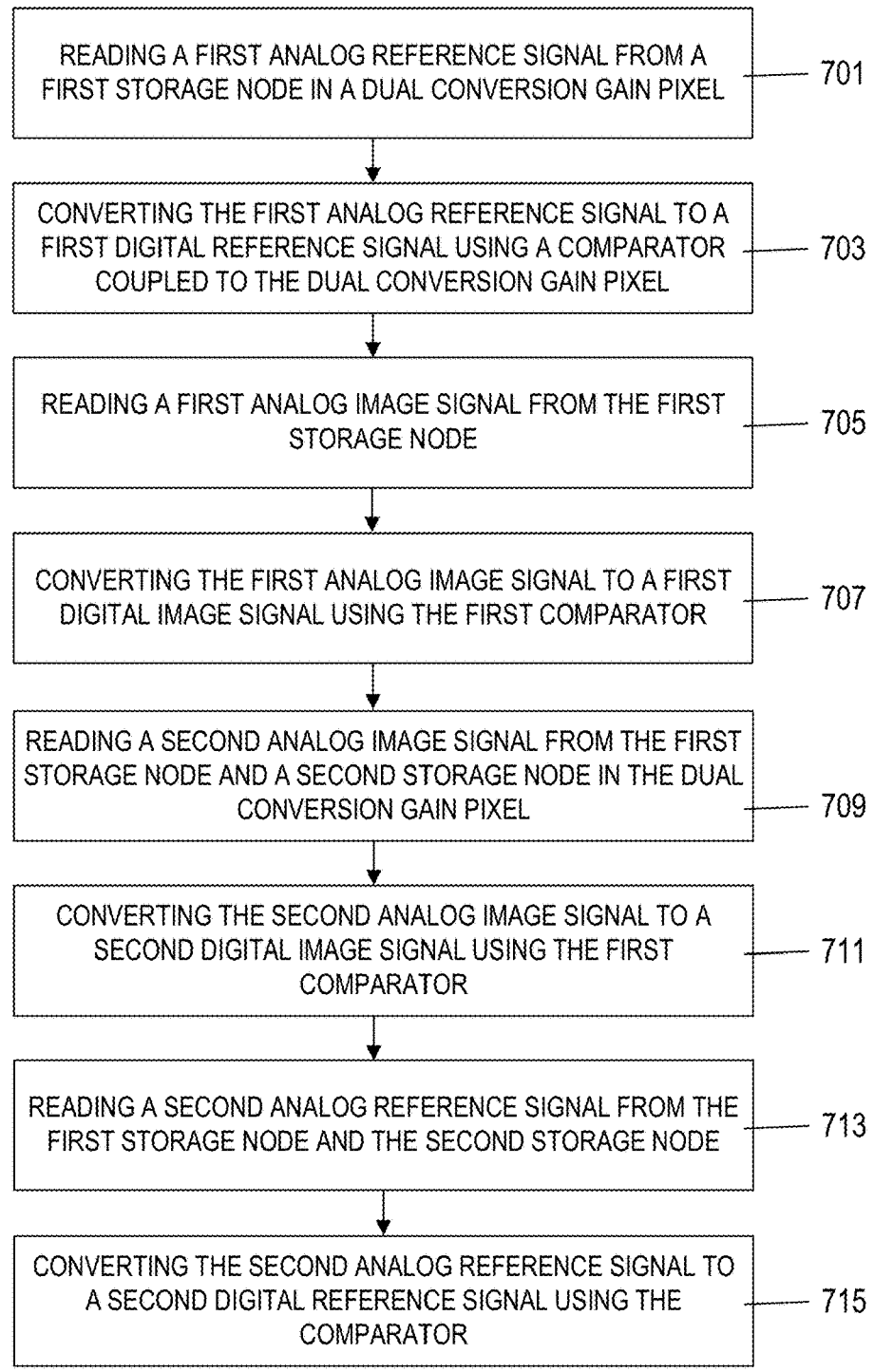
FIG. 7 illustrates a method of operating an image sensor with dual conversion gain readout, in accordance with the teachings of the present disclosure.

FIG. 7 illustrates a method 700 of operating an image sensor with dual conversion gain readout. One of ordinary skill in the art having the benefit of the present disclosure will appreciate that some of blocks 701-715 in FIG. 7 may occur in a different order than discussed and even in parallel. Moreover, blocks may be added to, or removed from, method 700 in accordance with the teachings of the present disclosure.

Block 701 shows reading a first analog reference signal (e.g., no stored image charge) from a first storage node (e.g., first storage node 109 in FIG. 1B) in a dual conversion gain pixel. In some examples, reading may include amplifying the voltage on the storage node using a source follower transistor and reading the amplified signal from a bitline.

Block 703 depicts converting the first analog reference signal to a first digital reference signal using a comparator (e.g., comparator 212 in FIG. 2) coupled to the dual conversion gain pixel. The first digital reference signal may be used to remove noise in the high conversion gain image data (see below).

Block 705 illustrates reading a first analog image signal (e.g., charge generated from a photodiode 101 of FIG. 1B absorbing light) from the first storage node. As with reading out the first analog reference signal, this may involve amplifying the signal on the storage node with a source follower and reading the amplified signal out to a bitline.

Block 707 shows converting the first analog image signal to a first digital image signal using the comparator. In the depicted example, converting the first analog image signal to the first digital image signal occurs between converting the first analog reference signal to the first digital reference signal and converting the second analog image signal to the second digital image signal. Put another way, block 707 occurs temporally after block 703 and before block 711. The first analog image signal may be used to form high conversion gain image data.

In some examples a ramp circuit (see e.g., FIGS. 4-5) is coupled to the comparator to output an offset signal after converting the first analog image signal to the first digital image signal. Put another way, the offset signal may be received by the comparator between blocks 707 and 711. In some examples, the offset signal includes adjusting an auto-zero voltage level output from the ramp circuit.

Block 709 depicts reading a second analog image signal from the first storage node and a second storage node (e.g., second storage node 109 including capacitor 111 in FIG. 1B) in the dual conversion gain pixel.

Block 711 illustrates converting the second analog image signal to a second digital image signal using the comparator. In the depicted example, converting the second analog image signal to the second digital image signal occurs between converting the first analog image signal to the first digital image signal and converting the second analog reference signal to the second digital reference signal. Put another way block 711 occurs after block 707 but before block 715. The second analog reference signal may be used to form low conversion gain image data because charge is read out of two storage nodes (and, in some examples, a capacitor as well).

Block 713 depicts reading a second analog reference signal from the first storage node and the second storage node.

Block 715 illustrates converting the second analog reference signal to a second digital reference signal using the comparator. The second analog reference signal may be used to remove noise in the low conversion gain image data.

It is appreciated that the converting steps shown in blocks 703, 707, 711, and 715 may be, at least in part, completed by outputting a ramp signal to the comparator from a ramp circuit coupled to the dual conversion gain pixel. As stated, the ramp signal is used by the comparator to convert the first analog reference signal to the first digital reference signal, convert the first analog image signal to the first digital image signal, convert the second analog image signal to the second digital image signal, and convert the second analog reference signal to the second digital reference signal. In some examples, outputting the ramp signal includes using a current source array coupled to a decoder to generate the ramp signal, and the decoder is coupled to gate terminals of a plurality of switches to activate the plurality of switches. In one example, the ramp signal is generated using a current integrator coupled between a current source, a current sink, and an output of the ramp circuit. And outputting the ramp signal includes controlling a direction of the ramp signal by turning on one of a first switch coupled between the current source and the current integrator, or a second switch coupled between the current sink and the current integrator.

In the above description, various pieces of circuitry are described. One of ordinary skill in the art having the benefit of the present disclosure will appreciate that the timing of electrical signals applied to the various pieces of circuitry can occur in any order and even in parallel. Moreover, pieces of circuitry and timing events may be added or removed, in accordance with the teachings of the present disclosure. It is appreciated that transistors may be referred to as "switches" or "gates" in accordance with the teachings of the present disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method, comprising:
   reading a first analog reference signal from a first storage node in a dual conversion gain pixel;
   converting the first analog reference signal to a first digital reference signal using a comparator coupled to the dual conversion gain pixel;
   reading a first analog image signal from the first storage node;
   converting the first analog image signal to a first digital image signal using the comparator;
   reading a second analog image signal from the first storage node and a second storage node in the dual conversion gain pixel;
   converting the second analog image signal to a second digital image signal using the comparator;
   reading a second analog reference signal from the first storage node and the second storage node; and
   converting the second analog reference signal to a second digital reference signal using the comparator.

2. The method of claim 1, wherein converting the first analog image signal to the first digital image signal occurs between converting the first analog reference signal to the first digital reference signal and converting the second analog image signal to the second digital image signal.

3. The method of claim 2, wherein converting the second analog image signal to the second digital image signal occurs between converting the first analog image signal to the first digital image signal and converting the second analog reference signal to the second digital reference signal.

4. The method of claim 1, further comprising outputting a ramp signal to the comparator from a ramp circuit coupled to the dual conversion gain pixel, wherein the ramp signal is used by the comparator to convert the first analog reference signal to the first digital reference signal, convert the first analog image signal to the first digital image signal, convert the second analog image signal to the second digital image signal, and convert the second analog reference signal to the second digital reference signal.

5. The method of claim 4, further comprising outputting an offset signal to the comparator with the ramp circuit between converting the first analog image signal to the first digital image signal and converting the second analog image signal to the second digital image signal.

6. The method of claim 5, wherein outputting the offset signal includes adjusting an auto-zero voltage level output from the ramp circuit.

7. The method of claim 4, wherein outputting the ramp signal includes using a current source array coupled to a decoder to generate the ramp signal.

8. The method of claim 7, wherein outputting the ramp signal includes controlling a direction of the ramp signal by turning on one of a first switch coupled between the current source and the current integrator or a second switch coupled between the current sink and the current integrator.

9. The method of claim 4, wherein the decoder is coupled to gate terminals of a plurality of switches to individually activate each of the plurality of switches, and wherein the plurality of switches is coupled between the current source array and an output of the ramp circuit.

10. The method of claim 4, wherein outputting the ramp signal includes using a current integrator coupled between a current source, a current sink, and an output of the ramp circuit.

11. An image sensor apparatus including an analog to digital converter, comprising:
    a dual conversion gain pixel including a photodiode coupled to a first storage node and a second storage node;
    a ramp circuit coupled to the dual conversion gain pixel to output a ramp signal; and
    a comparator coupled to the dual conversion gain photodiode and the ramp circuit to receive the ramp signal, wherein the comparator is configured to:
    convert a first analog reference signal, output from the first storage node, to a first digital reference signal;
    convert a first analog image signal, output from the first storage node, to a first digital image signal after converting the first analog reference signal;

convert a second analog image signal, output from the first storage node and the second storage node, to a second digital image signal after converting the first analog image signal; and convert a second analog reference signal, output from the first storage node and the second storage node, to a second digital reference signal after converting the second analog image signal.

12. The apparatus of claim 11, wherein the first storage node includes a floating diffusion, and the second storage node includes at least one of a floating diffusion or a capacitor.

13. The apparatus of claim 11, wherein the ramp circuit is coupled to output an offset signal to the comparator after converting the first analog image signal to a first digital image signal.

14. The apparatus of claim 13, wherein the offset signal adjusts an auto-zero voltage level output from the ramp circuit.

15. The apparatus of claim 11, wherein the ramp circuit includes a current source array coupled to a decoder to generate the ramp signal.

16. The apparatus of claim 15, wherein the decoder is coupled to gate terminals of a plurality of switches to activate the plurality of switches, and wherein the plurality of switches is disposed between the current source array and an output of the ramp circuit.

17. The apparatus of claim 11, wherein the ramp circuit includes a current integrator coupled between a current source, a current sink, and an output of the ramp circuit.

18. The apparatus of claim 17, wherein the ramp circuit includes a first switch coupled between the current source and the current integrator, and a second switch coupled between the current sink and the current integrator, and wherein a direction of the ramp signal is controlled by turning on the first switch or the second switch.

19. The apparatus of claim 11, wherein the comparator includes:

a first PMOS transistor and a second PMOS transistor coupled in parallel to a supply voltage, wherein the gate terminals of the first PMOS transistor and the second PMOS transistor are coupled to a drain terminal of the first PMOS transistor to form a current mirror;

a first NMOS transistor and a second NMOS transistor coupled in parallel, wherein the a first NMOS transistor and a second NMOS transistor are coupled to the first PMOS transistor and the second PMOS transistor respectively; and an NMOS tail transistor coupled to the first NMOS transistor, second NMOS transistor, and ground.

20. The apparatus of claim 11, further comprising a plurality of the dual conversion gain pixels including the dual conversion gain pixel disposed, at least in part, in a semiconductor material and arranged into an array.

* * * * *